US010075171B2

(12) United States Patent
Obata

(10) Patent No.: US 10,075,171 B2
(45) Date of Patent: Sep. 11, 2018

(54) OSCILLATOR, ELECTRONIC APPARATUS, AND MOVING OBJECT

(71) Applicant: Seiko Epson Corporation, Tokyo (JP)

(72) Inventor: Naohisa Obata, Minowa (JP)

(73) Assignee: Seiko Epson Corporation (JP)

( * ) Notice: Subject to any disclaimer, the term of this patent is extended or adjusted under 35 U.S.C. 154(b) by 166 days.

(21) Appl. No.: 15/075,661

(22) Filed: Mar. 21, 2016

(65) Prior Publication Data

US 2016/0285464 A1    Sep. 29, 2016

(30) Foreign Application Priority Data

Mar. 27, 2015    (JP) .................................. 2015-067358

(51) Int. Cl.
| | | |
|---|---|---|
| H03B 5/32 | (2006.01) | |
| H03L 1/04 | (2006.01) | |
| H03B 5/36 | (2006.01) | |
| H03L 1/02 | (2006.01) | |

(52) U.S. Cl.
CPC ................. *H03L 1/04* (2013.01); *H03B 5/36* (2013.01); *H03B 5/366* (2013.01); *H03L 1/022* (2013.01); *H03L 1/026* (2013.01); *H03L 1/028* (2013.01)

(58) Field of Classification Search
CPC .. H03B 5/36; H03B 5/366; H03L 1/04; H03L 1/026; H03L 1/022; H03L 1/028
USPC ............................. 331/158, 116 FE, 176, 154
See application file for complete search history.

(56) References Cited

U.S. PATENT DOCUMENTS

| | | | |
|---|---|---|---|
| 6,172,576 B1* | 1/2001 | Endo ...................... | H03B 5/368 331/108 D |
| 2001/0004226 A1* | 6/2001 | Piazza ................... | H03H 9/215 331/116 FE |
| 2009/0039970 A1* | 2/2009 | Shen ....................... | H03B 5/36 331/158 |
| 2013/0214648 A1 | 8/2013 | Yamada et al. | |

FOREIGN PATENT DOCUMENTS

| | | |
|---|---|---|
| JP | 2005-094410 A | 4/2005 |
| JP | 2006-108949 A | 4/2006 |
| JP | 2008-306594 A | 12/2008 |
| JP | 2010-178109 A | 8/2010 |
| JP | 2013-172222 A | 9/2013 |
| JP | 2013-243481 A | 12/2013 |
| JP | 2014-192832 A | 10/2014 |

* cited by examiner

*Primary Examiner* — Arnold Kinkead
(74) *Attorney, Agent, or Firm* — Harness, Dickey & Pierce, P.L.C.

(57) ABSTRACT

An oscillator includes a resonator element; an oscillation circuit which outputs an oscillation signal by oscillating the resonator element; and a temperature compensation circuit as a frequency control circuit which controls an oscillation frequency of the oscillation signal, wherein, if a resonance frequency of the resonator element is referred to as Fr (MHz) and an equivalent series capacitance is referred to as C1 (fF), a relationship of $C1 \geq 0.00279 \times Fr^2 - 0.05684 \times Fr + 2.69481$ is satisfied.

15 Claims, 11 Drawing Sheets

OSCILLATOR, ELECTRONIC APPARATUS, AND MOVING OBJECT

BACKGROUND

1. Technical Field

The present invention relates to an oscillator, an electronic apparatus, and a moving object.

2. Related Art

A temperature compensated crystal oscillator (TCXO) includes a crystal resonator and an integrated circuit (IC) for oscillating the crystal resonator, and can obtain high frequency accuracy, as the IC compensates (temperature-compensates) for deviation (frequency deviation) from a desired frequency (nominal frequency) of an oscillation frequency of a crystal resonator at a predetermined temperature range. An AT cut resonator is used as a resonator of the TCXO. Since the AT cut resonator exhibits frequency temperature characteristics of a third order curved line, the AT cut resonator has an advantage in which a stable frequency is obtained at a wide temperature range, compared to other cut resonators. Recently, an AT cut resonator has been miniaturized by applying a lithography technology to processing of quartz crystal. An AT cut resonator is disclosed in, for example, JP-A-2005-094410. A TCXO is disclosed in, for example, JP-A-2013-243481.

However, since frequency variable sensitivity (element sensitivity) of an AT cut resonator decreases according to miniaturization of the AT cut resonator, it is necessary to widen a variable range of a voltage (temperature compensation voltage) which is applied to a variable capacitance element by an IC, in order to realize a greater frequency variable width than a width of frequency deviation of the AT cut resonator at a predetermined temperature range, for example. By doing so, a temperature compensation voltage that exceeds a voltage range in which a capacitance value approximately linearly changes is applied to a variable capacitance element, temperature compensation accuracy is degraded, an output frequency of a temperature compensated oscillator changes depending on temperature, and thus, there is a problem that frequency deviation increases.

SUMMARY

An advantage of some aspects of the invention is to provide an oscillator which can perform frequency control more excellently than an oscillator of the related art, and in addition, to provide an electronic apparatus and a moving object which use the oscillator.

The invention can be implemented as the following forms or application examples.

Application Example 1

An oscillator according to this application example includes a resonator element; an oscillation circuit which outputs an oscillation signal by oscillating the resonator element; and a frequency control circuit which controls an oscillation frequency of the oscillation signal, in which, if a resonance frequency of the resonator element is referred to as Fr (MHz) and an equivalent series capacitance is referred to as C1 (fF), a relationship of $C1 \geq 0.00279 \times Fr^2 - 0.05684 \times Fr + 2.69481$ is satisfied.

Various oscillation circuits such as, a Pierce oscillation circuit, an inverter type oscillation circuit, a Colpitts oscillation circuit, or a Hartley oscillation circuit may be configured by a resonator element and an oscillation circuit.

According to this application example, by using a resonator element with high frequency variable sensitivity that is defined by a condition of $C1 \geq 0.00279 \times Fr^2 - 0.05684 \times Fr + 2.69481$, it is possible to realize an oscillator which performs frequency control more excellently than an oscillator of the related art, and for example, it is possible to realize a temperature compensated oscillator with frequency deviation which is smaller than that of the related art.

Application Example 2

In the oscillator according to the application example, the equivalent series capacitance may be greater than 1.5 fF.

According to the oscillator of this application example, by using a resonator element with high frequency variable sensitivity that is defined by a condition in which the equivalent series capacitance is greater than 1.5 fF, it is possible to realize an oscillator which performs frequency control more excellently than an oscillator of the related art, and for example, it is possible to realize a temperature compensated oscillator with frequency deviation which is smaller than that of the related art.

Application Example 3

In the oscillator according to the application example, the frequency control circuit may include a circuit which changes the oscillation frequency with respect to a voltage which is input, and a change ratio of the oscillation frequency with respect to the voltage which is input may be greater than or equal to 42 ppm/V.

According to this application example, by using a resonator element with high frequency variable sensitivity that is defined by a condition in which the change ratio of the oscillation frequency is greater than or equal to 42 ppm/V, it is possible to realize an oscillator which performs frequency control more excellently than an oscillator of the related art, and for example, it is possible to realize a temperature compensated oscillator with frequency deviation which is smaller than that of the related art.

Application Example 4

In the oscillator according to the application example, if an equivalent parallel capacitance of the resonator element is referred to as C0 and a capacitance ratio of the resonator element is referred to as γ, a relationship of γ=C0/C1, and $\gamma \leq 0.022 \times Fr^2 - 4.969 \times Fr + 417.929$ may be satisfied.

According to this application example, by using a resonator element with high frequency variable sensitivity that is defined by a condition in which, $\gamma \geq 0.022 \times Fr^2 - 4.969 \times Fr + 417.929$ is satisfied, it is possible to realize an oscillator which performs frequency control more excellently than an oscillator of the related art, and for example, it is possible to realize a temperature compensated oscillator with frequency deviation which is smaller than that of the related art.

Application Example 5

In the oscillator according to the application example, deviation from a desired frequency may be greater than or equal to −150 ppb and smaller than or equal to +150 ppb in a temperature range from −40° C. to +85° C.

The oscillator according to this application example is an unprecedented oscillator which exhibits frequency temperature characteristics of an OCXO with frequency deviation which is greater than or equal to −150 ppb and smaller than or equal to +150 ppb in a temperature range from −40° C. to +85° C. Therefore, the oscillator according to this application example can be used for the electronic apparatus requiring high frequency accuracy which is used for OCXO.

Application Example 6

In the oscillator according to the application example, deviation of resonance frequency with respect to an approximation equation which is higher than or equal to a third order of frequency temperature characteristics of the resonator element, may be greater than or equal to −150 ppb and smaller than or equal to +150 ppb.

According to this application example, it is possible to easily realize the oscillator with frequency deviation of the frequency temperature characteristics which is greater than or equal to −150 ppb and smaller than or equal to +150 ppb, even if variations of the temperature characteristics of the oscillation circuit and the frequency control circuit are taken into account, and thus, it is possible to increase the yield of the oscillator.

Application Example 7

An oscillator according to this application example includes: a resonator element; an integrated circuit including an oscillation circuit which outputs an oscillation signal by oscillating the resonator element, a frequency control circuit which controls an oscillation frequency of the oscillation signal, and a first surface in which a terminal that is electrically connected to the resonator element is disposed; a first container which contains the resonator element and includes a first lid of a metal which overlaps the resonator element in a planar view; and a second container which contains the first container and the integrated circuit, in which the first container is disposed such that a surface of the first container opposite to the first lid side faces an inner surface of the second container, in which the integrated circuit having a surface on a side opposite to the first surface is bonded to the first lid through an adhesive member, and in which, if a resonance frequency of the resonator element is referred to as Fr (MHz) and an equivalent series capacitance is referred to as C1 (fF), a relationship of $C1 \geq 0.00279 \times Fr^2 - 0.05684 \times Fr + 2.69481$ is satisfied.

Various oscillation circuits such as, a Pierce oscillation circuit, an inverter type oscillation circuit, a Colpitts oscillation circuit, or a Hartley oscillation circuit may be configured by a resonator element and an oscillation circuit.

According to this application example, by using a resonator element with high frequency variable sensitivity that is defined by a condition of $C1 \geq 0.00279 \times Fr^2 - 0.05684 \times Fr + 2.69481$, it is possible to realize an oscillator which performs frequency control more excellently than an oscillator of the related art, and for example, it is possible to realize a temperature compensated oscillator with frequency deviation which is smaller than that of the related art. In addition, the integrated circuit including the oscillation circuit and the temperature compensation circuit is connected to the first lid of a metal of the first container which contains the resonator element through the adhesive member. As a result, in the oscillator according to the present application example, since heat generated in the integrated circuit is conducted to the resonator element at a short time, a temperature difference between the integrated circuit and the resonator element decreases, an error of the temperature compensation performed by the temperature compensation circuit is reduced, and frequency stability can increase.

Application Example 8

In the oscillator according to the application example, the equivalent series capacitance may be greater than 1.5 fF.

According to this application example, by using a resonator element with high frequency variable sensitivity that is defined by a condition in which the equivalent series capacitance is greater than 1.5 fF, it is possible to realize an oscillator which performs frequency control more excellently than an oscillator of the related art, and for example, it is possible to realize a temperature compensated oscillator with frequency deviation which is smaller than that of the related art.

Application Example 9

In the oscillator according to the application example, the frequency control circuit may include a circuit which changes the oscillation frequency with respect to a voltage which is input, and a change ratio of the oscillation frequency with respect to the voltage which is input may be greater than or equal to 42 ppm/V.

According to this application example, by using a resonator element with high frequency variable sensitivity that is defined by a condition in which the change ratio of the oscillation frequency is greater than or equal to 42 ppm/V, it is possible to realize an oscillator which performs frequency control more excellently than an oscillator of the related art, and for example, it is possible to realize a temperature compensated oscillator with frequency deviation which is smaller than that of the related art.

Application Example 10

In the oscillator according to the application example, the second container may include a second lid which overlaps the first container and the integrated circuit in a planar view, the inner surface may include a surface on which wires are disposed, and a surface on which the second lid is exposed, and the first container may be disposed on a surface on which the wires are disposed.

According to this application example, it is possible to increase the frequency stability more than that of the related art, and degree of freedom of an electrical connection between the resonator element and the integrated circuit increases.

Application Example 11

An electronic apparatus according to this application example includes any of the oscillators described above.

Application Example 12

A moving object according to this application example includes any of the oscillators described above.

According to these application examples, the oscillator which performs frequency control more excellently than an oscillator of the related art is used, and thus, for example, it is possible to realize the electronic apparatus and the moving object which include high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. The embodiments which will be described hereinafter do not unduly limit the content of the invention described in the scope of the appended claims. In addition, the entire configurations which will be described hereinafter are not limited as essential configuration requirements of the invention.

1. Oscillator

Configuration of Oscillator

Figure 1:
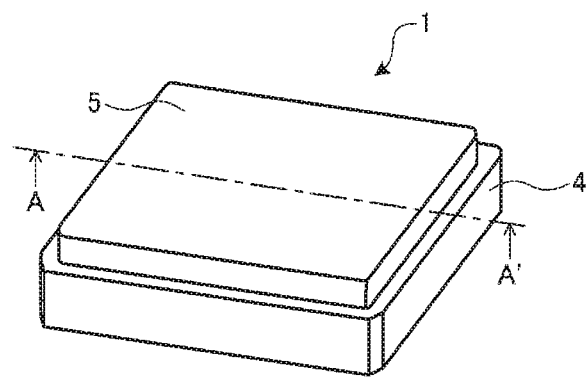
FIG. 1 is a perspective view of an oscillator according to the present embodiment.
Figure 2A:
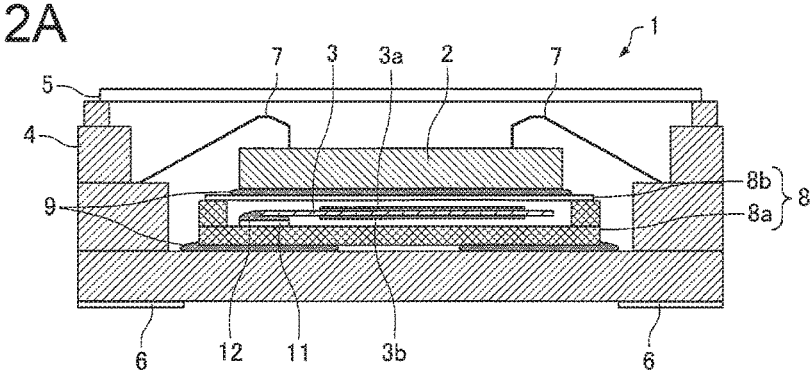
FIG. 2A is a sectional view of the oscillator according to the present embodiment.
Figure 2B:
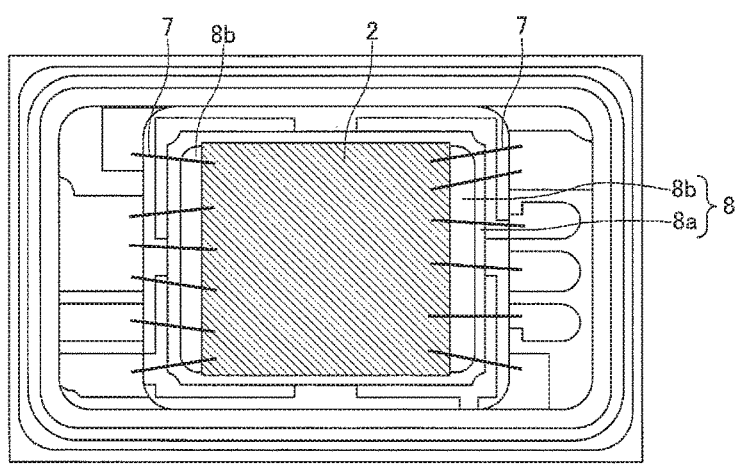
FIG. 2B is a top view of the oscillator according to the present embodiment.
Figure 2C:
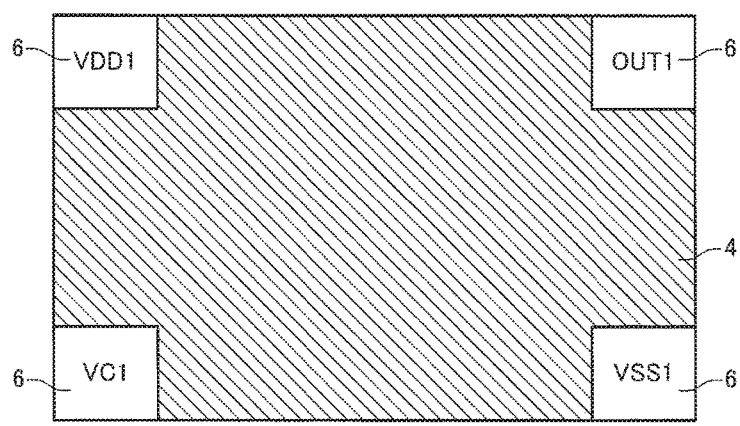
FIG. 2C is a bottom view of the oscillator.

FIG. 1 and FIGS. 2A to 2C are views illustrating an example of a configuration of an oscillator according to the present embodiment. FIG. 1 is a perspective view of the oscillator, FIG. 2A is a sectional view taken along line A-A' of FIG. 1, FIG. 2B is a top view of the oscillator, and FIG. 2C is a bottom view of the oscillator. However, FIG. 2B is illustrated in a state in which there is no lid 5 of FIG. 2A.

As illustrated in FIG. 1 and FIGS. 2A to 2C, an oscillator 1 according to the present embodiment is configured to include an integrated circuit (IC) 2 that is a semiconductor device, a resonator element (resonator reed) 3, a package 4, the lid (cover) 5, and an external terminal (external electrode) 6.

For example, a crystal resonator element, a surface acoustic wave (SAW) resonance element, other piezoelectric resonator elements or micro electromechanical systems (MEMS) resonator element, or the like can be used as the resonator element 3. A piezoelectric material such as, piezoelectric single crystal such as quartz crystal, lithium tantalate, lithium niobate, piezoelectric ceramics such as lead zirconate titanate, a silicon semiconductor material, or the like can be used as a substrate material of the resonator element 3. A material which uses piezoelectric effects, or a material which uses electrostatic drive that is performed by Coulomb force may be used as an excitation unit of the resonator element 3.

The package 4 contains the integrated circuit (IC) 2 and the resonator element 3 in the same space. Specifically, a concave section is provided in the package 4, and the package 4 contains the integrated circuit (IC) 2 and the resonator element 3 by covering the concave section using the lid 5. Wires (not illustrated) for electrically connecting two terminals (an XO terminal and an XI terminal of FIG. 3 which will be described below) of the integrated circuit (IC) 2 to two terminals (excitation electrodes 3a and 3b) of the resonator element 3, respectively, are provided in the inside of the package 4 or on a surface of the concave section. In addition, wires (not illustrated) which are electrically connected to each of the external terminals 6 are provided in the inside of the package 4 or on the surface of the concave section, and each wire is bonded to each terminal of the integrated circuit (IC) 2 by bonding wires 7 of gold or the like.

As illustrated in FIG. 2C, an external terminal VDD1 that is a power supply terminal, an external terminal VSS1 that is a ground terminal, an external terminal VC1 that is a terminal to which a signal for a frequency control is input, and four external terminals 6 of an external terminal OUT1 that is an output terminal are provided on a bottom surface (a rear surface of the package 4) of the oscillator 1. A power supply voltage is supplied to the external terminal VDD1, and the external terminal VSS1 is grounded.

The resonator element 3 includes the excitation electrodes 3a and 3b of a metal on a front surface and a rear surface thereof, respectively, and oscillates at a desired frequency (frequency required by the oscillator 1) corresponding to mass of the resonator element 3 including the excitation electrodes 3a and 3b.

In the present embodiment, the resonator element 3 is contained in a package (container) 8 (the resonator element 3 is fixed to an electronic pad 11 which is disposed on a base 8a by a connection member 12 such as conductive adhesive). The package 8 includes the base 8a and a lid 8b (cover) which seals the base 8a, and the base 8a is bonded to the package 4 by an adhesive member 9 such as a resin. In addition, the integrated circuit (IC) 2 is bonded to the lid 8b by the adhesive member 9.

As illustrated in FIG. 2B, in a planar view in which the oscillator 1 is viewed from an upper surface thereof, the integrated circuit (IC) 2 overlaps the package 8 (the resonator element 3), and the integrated circuit (IC) 2 is directly attached to the lid 8b of the package 8 which contains the resonator element 3. As a result, heat of the integrated circuit (IC) 2 is conducted to the resonator element 3 for a short time, and thus, a temperature difference between the integrated circuit (IC) 2 and the resonator element 3 decreases, and an error of temperature compensation performed by, for example, a temperature compensation circuit 40 which will be described below as a frequency control circuit is reduced. Hence, a structure of the oscillator 1 illustrated in FIGS. 2A to 2C is more effective to increase frequency accuracy. It is preferable that a material of the lid 8b is metal with high thermal conductivity.

Figure 3:
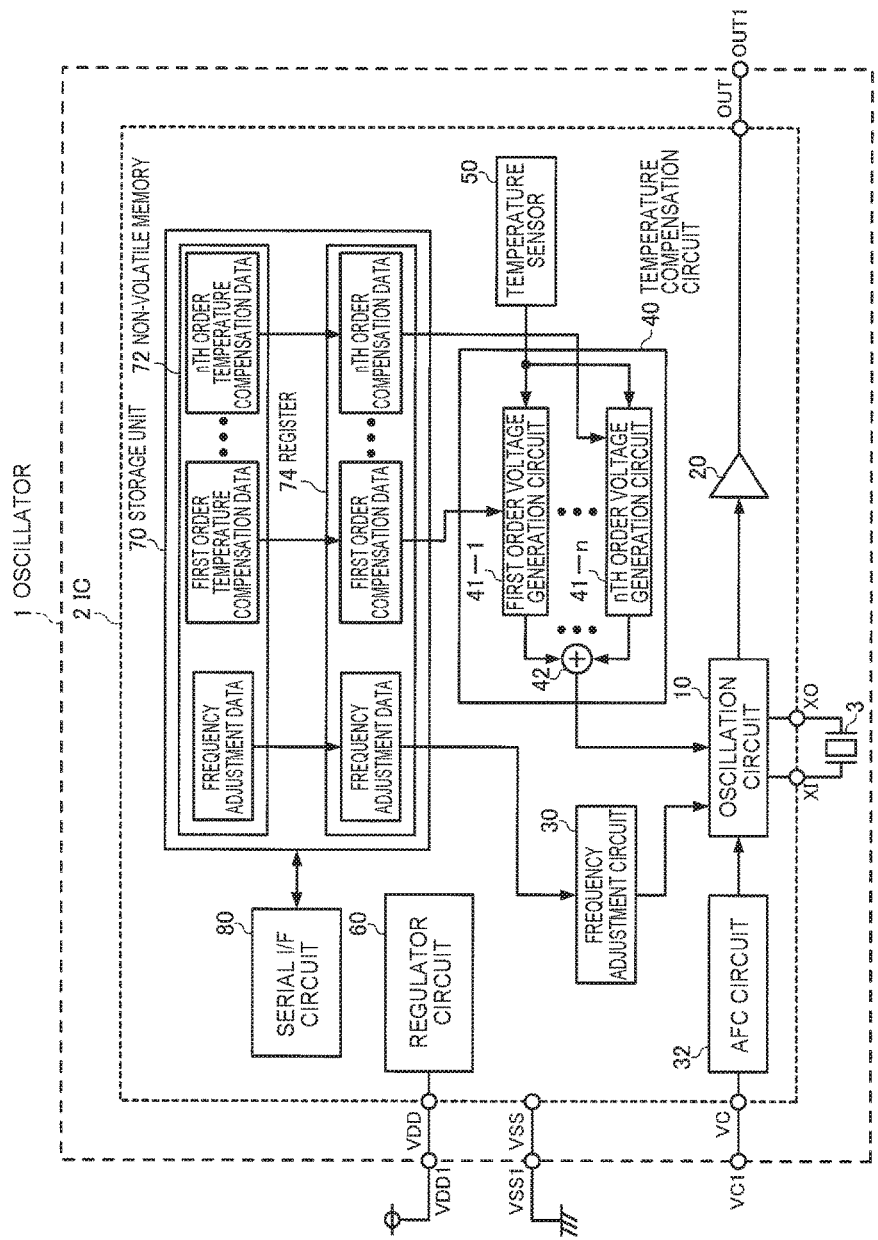
FIG. 3 is a functional block diagram of the oscillator according to the present embodiment.

FIG. 3 is a functional block diagram of the oscillator 1. As illustrated in FIG. 3, the oscillator 1 includes the resonator element 3 and the integrated circuit (IC) 2 for oscillating the resonator element 3, and the integrated circuit (IC) 2 and the resonator element 3 are contained in the package 4.

The integrated circuit (IC) 2 includes a VDD terminal that is a power supply terminal, a VSS terminal that is a ground terminal, an OUT terminal that is an output terminal, a VC terminal to which a signal that controls a frequency is input, an XI terminal and an XO terminal that are connection terminals connected to the resonator element 3. The VDD terminal, the VSS terminal, the OUT terminal, and the VC terminal are exposed on a surface of the integrated circuit (IC) 2, and are respectively connected to external terminals VDD1, VSS1, OUT1, and VC1 which are provided in the package 4. In addition, the XI terminal is connected to one terminal (terminal on a side) of the resonator element 3, and the XO terminal is connected to the other terminal (terminal on the other side) of the resonator element 3.

In the present embodiment, the integrated circuit (IC) 2 is configured to include an oscillation circuit 10, an output circuit 20, a frequency adjustment circuit 30, an automatic frequency control (AFC) circuit 32, a temperature compensation circuit 40, a temperature sensor 50, a regulator circuit 60, a storage unit 70, and a serial interface (I/F) circuit 80. The integrated circuit (IC) 2 may have a configuration in which a part of the elements is omitted or changed, or may have a configuration in which other elements are added.

The regulator circuit 60 generates a part or all of a power supply voltage, or a constant voltage which becomes a reference voltage of the oscillation circuit 10, the frequency adjustment circuit 30, the AFC circuit 32, the temperature compensation circuit 40, and the output circuit 20, based on the power supply voltage VDD (positive voltage) which is supplied from the VDD terminal.

The storage unit 70 includes a non-volatile memory 72 and a register 74, and is configured to be able to perform reading of data from or writing of data to the non-volatile memory 72 or the register 74 from an external terminal through the serial interface circuit 80. In the present embodiment, the terminals of the integrated circuit (IC) 2 which are connected to the external terminals of the oscillator 1 are just four terminals of VDD, VSS, OUT, and VC, and thus, for example, when a voltage at the VDD terminal is higher than a threshold, the serial interface circuit 80 receives a clock signal which is input from the VC terminal and a data signal which is input from the OUT terminal, and performs reading of data from or writing of data to the non-volatile memory 72 or the register 74.

The non-volatile memory 72 is a storage unit for storing various control data, and may be various rewritable non-volatile memories, such as, an electrically erasable programmable read-only memory (EEPROM) or a flash memory, or may be various non-volatile memories which are not rewritable such as a one-time programmable read only memory (PROM).

The non-volatile memory 72 stores frequency adjustment data for controlling the frequency adjustment circuit 30 or temperature compensation data (first order compensation data, . . . , nth order compensation data) for controlling, for example, the temperature compensation circuit 40 as a frequency control circuit. Furthermore, the non-volatile memory 72 also stores data (not illustrated) for respectively controlling the output circuit 20 and the AFC circuit 32.

The frequency adjustment data is data for adjusting the frequency of the oscillator 1, and if the frequency of the oscillator 1 is shifted from a desired frequency, the frequency adjustment data is rewritten, and thus fine adjustment can be made such that the frequency of the oscillator 1 approximates a desired frequency.

The temperature compensation data (first order compensation data, . . . , nth order compensation data) is calculated during a temperature compensation adjustment step of the oscillator 1, is data for compensating for frequency temperature characteristics of the oscillator 1, and may be first to nth order coefficient values according to each order component of the frequency temperature characteristics of the resonator element 3. Here, a value which negates frequency temperature characteristics of the resonator element 3, and furthermore, can also compensate for the influence of the temperature characteristics of the integrated circuit (IC) 2 is selected as the maximum order n of the temperature compensation data. For example, n may be an integer value which is greater than a major order of the frequency temperature characteristics of the resonator element 3. For example, if the resonator element 3 is an AT cut quartz crystal resonator element, the frequency temperature characteristics exhibit a third curved line, a major order thereof is 3, and thus, an integer value (for example, 5 or 6) which is greater than 3 may be selected as n. The temperature compensation data may include all of the first to nth order compensation data, and may include only a part of the first to nth order compensation data.

Each piece of the data that is stored in the non-volatile memory 72 is transferred from the non-volatile memory 72 to the register 74, and retained in the register 74, when a power supply is supplied to the integrated circuit (IC) 2 (when the voltage at the VDD terminal increases from zero volts to a desired voltage). Then, frequency adjustment data which is retained in the register 74 is input to the frequency adjustment circuit 30, the temperature compensation data (first order compensation data, . . . , nth order compensation data) which is retained in the register 74 is input to the temperature compensation circuit 40, and data for each control which is retained in the register 74 is also input to the output circuit 20 or the AFC circuit 32.

If it is not possible to rewrite data to the non-volatile memory 72, when the oscillator 1 is inspected, each piece of data is directly written to each bit of the register 74 which retains each piece of data that is transferred from the non-volatile memory 72, from an external terminal through the serial interface circuit 80, and thereby the oscillator 1 is adjusted and selected so as to satisfy desired characteristics, and each piece of data which is adjusted and selected is finally written to the non-volatile memory 72. In addition, if the non-volatile memory 72 is rewritable, when the oscillator 1 is inspected, each piece of data may be written to the non-volatile memory 72 from an external terminal through the serial interface circuit 80. However, since writing to the non-volatile memory 72 takes time in general, each piece of data may be directly written to each bit of the register 74 from an external terminal through the serial interface circuit 80, and each piece of data which is adjusted and selected may be finally written to the non-volatile memory 72, in order to reduce inspection time, when the oscillator 1 is inspected.

The oscillation circuit 10 amplifies an output signal of the resonator element 3 for feeding back to the resonator element 3, and thereby the resonator element 3 oscillates and an oscillation signal is output based on the oscillation of the resonator element 3. For example, a current at an oscillation stage of the oscillation circuit 10 is controlled by the control data that is retained in the register 74.

The frequency adjustment circuit 30 generates a voltage according to the frequency adjustment data that is retained in the register 74, and applies the voltage to one terminal of a variable capacitance element (not illustrated) which functions as a load capacitor of the oscillation circuit 10. As a result, an oscillation frequency (reference frequency) of the oscillation circuit 10 at predetermined temperature (for example, 25° C.) and in a condition in which a voltage at the VC terminal becomes a predetermined voltage (for example, VDD/2) is controlled (finely adjusted) so as to be approximately a desired frequency.

The AFC circuit 32 generates a voltage according to a voltage at the VC terminal, and applies the voltage to one terminal of a variable capacitance element (not illustrated) which functions as a load capacitor of the oscillation circuit 10. As a result, the oscillation frequency (oscillation frequency of the resonator element 3) of the oscillation circuit 10 is controlled based on a voltage value of the VC terminal. For example, a gain of the AFC circuit 32 may be controlled by the control data that is retained in the register 74.

The temperature sensor 50 is a temperature sensing element which outputs a signal (for example, a voltage corresponding to temperature) corresponding to temperature of periphery thereof. The temperature sensor 50 may have positive polarity in which the higher the temperature is, the more an output voltage increases, or may have negative polarity in which the higher the temperature is, the more an output voltage decreases. It is preferable that an output voltage of the temperature sensor 50 changes with respect to a temperature change as linearly as possible, in a desired temperature range in which an operation of the oscillator 1 is guaranteed.

The temperature compensation circuit 40 receives an output signal from the temperature sensor 50, generates a voltage (temperature compensation voltage) for compensating for frequency temperature characteristics of the resonator element 3, and applies the voltage to one terminal of a variable capacitance element (not illustrated) which functions as a load capacitor of the oscillation circuit 10. As a result, the oscillation frequency of the oscillation circuit 10 is controlled so as to be approximately constant regardless of temperature. In the present embodiment, the temperature compensation circuit 40 is configured to include a first order voltage generation circuit 41-1 to an nth order voltage generation circuit 41-n, and an addition circuit 42.

The first order voltage generation circuit 41-1 to the nth order voltage generation circuit 41-n respectively receive the output signal of the temperature sensor 50, and generate a first order compensation voltage to an nth order compensation voltage which compensate frequency temperature characteristics from first order components to nth order components, according to first compensation data to nth order compensation data that are retained in the register 74.

The addition circuit 42 adds the first order compensation voltage to the nth order compensation voltage to each other which are respectively generated by the first order voltage generation circuit 41-1 to the nth order voltage generation circuit 41-n, and outputs the voltages. An output voltage of the addition circuit 42 becomes an output voltage (temperature compensation voltage) of the temperature compensation circuit 40.

The output circuit 20 receives an oscillation signal which is output from the oscillation circuit 10, generates an oscillation signal for an external output, and outputs the oscillation signal to the outside through the OUT terminal. For example, a frequency division ratio or an output level of the oscillation signal of the output circuit 20 may be controlled by the control data which is retained in the register 74.

The oscillator 1 which is configured as described above functions as a temperature compensated oscillator of a voltage control type (a voltage controlled temperature compensated crystal oscillator (VC-TCXO), if the resonator element 3 is a quartz crystal resonator element) which outputs an oscillation signal of a constant frequency corresponding to a voltage of the external terminal VC1 in a desired temperature range, regardless of temperature.

Method of Manufacturing Oscillator

Figure 4:
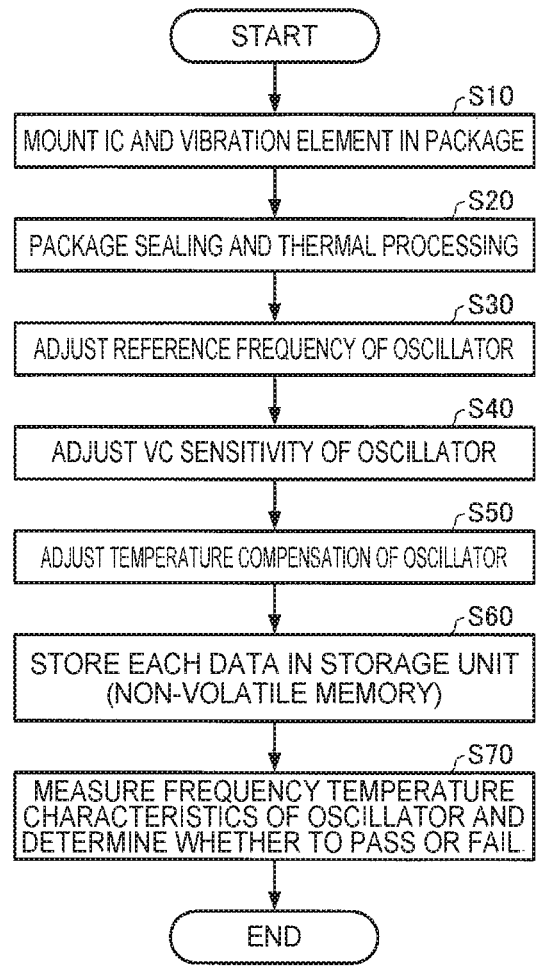
FIG. 4 is a flowchart illustrating an example of the sequence of a method of manufacturing the oscillator.

FIG. 4 is a flowchart illustrating an example of the sequence of a method of manufacturing the oscillator 1 according to the present embodiment. A part of step S10 to S70 of FIG. 4 may be omitted or changed, or other steps may be added thereto. In addition, the sequence of each step may be appropriately changed in a possible range.

In an example of FIG. 4, the integrated circuit (IC) 2 and the resonator element 3 (the package 8 which contains the resonator element 3) are first mounted in the package 4 (S10). In step S10, the integrated circuit (IC) 2 is connected to the resonator element 3 by a wire which is provided in the inside of the package 4 or on a surface of the concave portion, and if a power supply is supplied to the integrated circuit (IC) 2, the integrated circuit (IC) 2 is electrically connected to the resonator element 3.

Subsequently, the package 4 is sealed with the lid 5, and the lid 5 adheres to the package 4 by thermal processing (S20). Assembly of the oscillator 1 is completed in step S20.

Subsequently, a reference frequency (frequency at reference temperature T0 (for example, 25° C.)) of the oscillator 1 is adjusted (S30). In step S30, a frequency is measured by oscillating the oscillator 1 at the reference temperature T0, and frequency adjustment data is determined such that frequency deviation approximates zero.

Subsequently, VC sensitivity of the oscillator 1 is adjusted (S40). In step S40, a frequency is measured by oscillating the oscillator 1 in a state in which a predetermined voltage (for example, 0 V or VDD) is applied to the external terminal VC1, and adjustment data of the AFC circuit 32 is determined such that a desired VC sensitivity is obtained.

Subsequently, temperature compensation adjustment of the oscillator 1 is performed (S50). In temperature compensation adjustment step S50, a frequency of the oscillator 1 is measured at multiple temperatures in a desired temperature range (for example, from −40° C. or higher to 85° C. or lower), and temperature compensation data (first order compensation data, . . . , nth order compensation data) for compensating for the frequency temperature characteristics of the oscillator 1 is generated based on the measured results. Specifically, a calculation program of the temperature compensation data approximates the frequency temperature characteristics (including frequency temperature characteristics of the resonator element 3 and temperature characteristics of the integrated circuit (IC) 2) of the oscillator 1 by an nth order equation which uses temperature (an output voltage of the temperature sensor 50) as variables, using the measured results of the frequencies at multiple temperatures, and generates temperature compensation data (first order compensation data, . . . , nth order compensation data) according to an approximation equation. For example, the calculation program of the temperature compensation data sets frequency deviation at the reference temperature T0 to zero, and generates the temperature compensation data (first order compensation data, . . . , nth order compensation data) such that a width of the frequency deviation in a desired temperature range decreases.

Subsequently, each piece of data which is obtained in steps S30, S40, and S50 is stored in the non-volatile memory 72 of the storage unit 70 (S60).

Finally, acceptability of the frequency temperature characteristics of the oscillator 1 is determined (S70). In step S70, frequencies of the oscillator 1 are measured while gradually changing the temperature, and it is evaluated whether or not the frequency deviation is within a predetermined range in a desired temperature range (for example, from −40° C. or higher to 85° C. or lower). It is determined that the oscillator is good if frequency deviation thereof is within a predetermined range, and the oscillator fails if frequency deviation thereof is out of the predetermined range.

Frequency Temperature Characteristics of Oscillator

Figure 5:
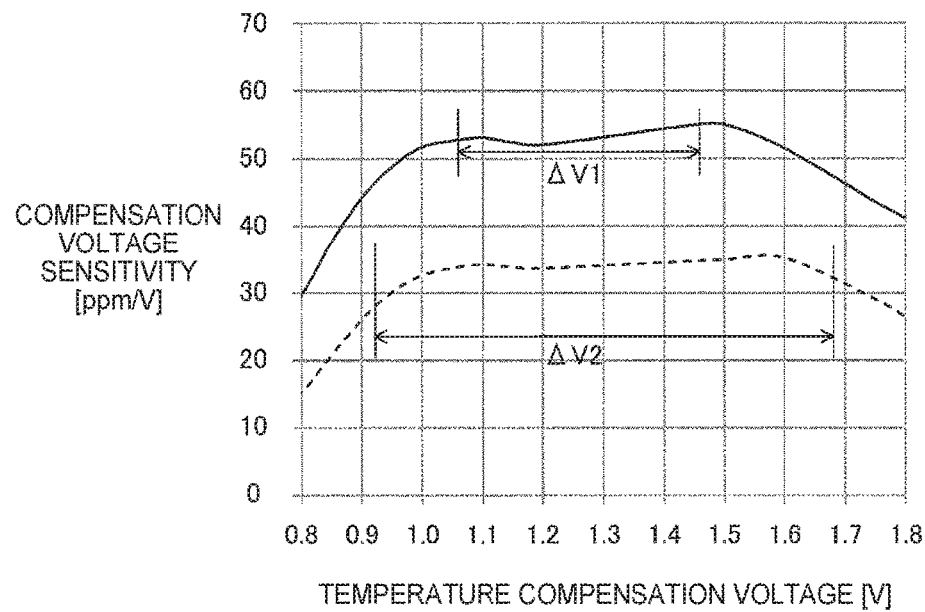
FIG. 5 is a diagram illustrating an example of a relationship between a temperature compensation voltage and compensation voltage sensitivity.

There is a correlation between the frequency temperature characteristics of the oscillator 1 and frequency variable sensitivity (element sensitivity) of the resonator element 3. FIG. 5 is a diagram illustrating an example of a relationship between a temperature compensation voltage and compensation voltage sensitivity (degree of a frequency change with respect to a change of temperature compensation voltage). In FIG. 5, a horizontal axis denotes a temperature compensation voltage (unit: V), and a vertical axis denotes compensation voltage sensitivity (unit: ppm/V). A solid line is a graph which is plotted by using the resonator element 3 with high frequency variable sensitivity, and a dashed line is a graph which is plotted by using the resonator element 3 with low frequency variable sensitivity.

As illustrated in FIG. 5, if the resonator element 3 with low frequency variable sensitivity is used, it is necessary for the integrated circuit (IC) 2 to widen a variable range (ΔV2 of FIG. 5) of the temperature compensation voltage such that a frequency variable width of the oscillator 1 is widened more than a width of frequency division of the resonator element 3 in a desired temperature range (for example, from −40° C. or higher to 85° C. or lower). By doing so, a temperature compensation voltage exceeding a voltage range in which compensation voltage sensitivity is approximately constant is applied to a variable capacitance element (for example, varactor), and thereby the temperature compensation accuracy is degraded. Accordingly, the frequency temperature characteristics of the oscillator 1 are degraded. In contrast to this, if the resonator element 3 with high frequency variable sensitivity is used, the integrated circuit (IC) 2 can narrow a variable range (ΔV1 of FIG. 5) of the temperature compensation voltage. As a result, the temperature compensation voltage applied to the variable capacitance element is within a voltage range in which the compensation voltage sensitivity is approximately constant, and the frequency temperature characteristics of the oscillator 1 increase.

That is, as the frequency variable sensitivity of the resonator element 3 increases, the frequency deviation of the oscillator 1 in a desired temperature range is reduced. Then, as the frequency variable sensitivity of the resonator element 3 increases, the compensation voltage sensitivity also increases, and thus, as the compensation voltage sensitivity increases, the frequency deviation of the oscillator 1 within a desired temperature range can be reduced.

Figure 6:
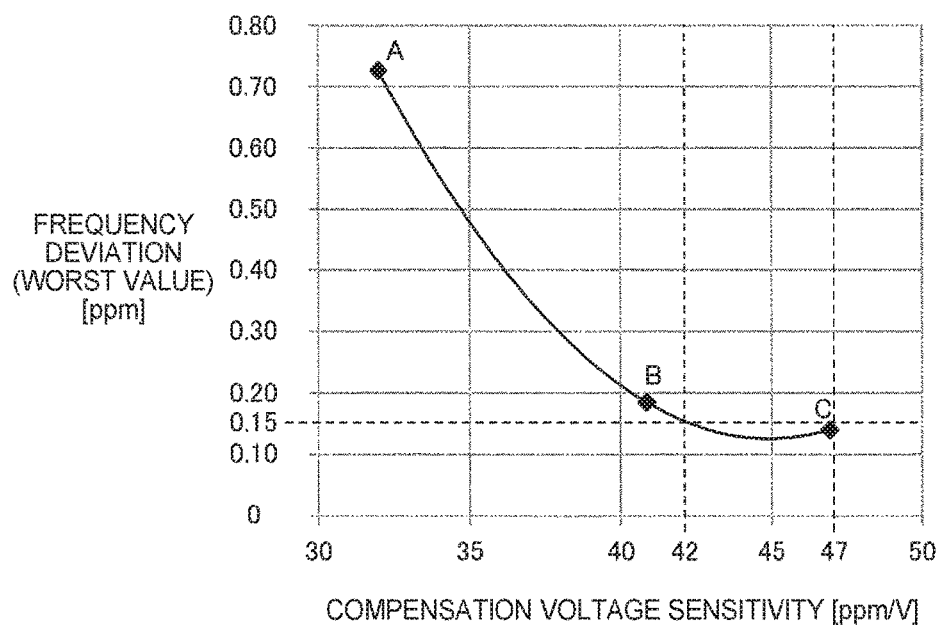
FIG. 6 is a diagram illustrating a measured value of frequency deviation of the oscillator.

FIG. 6 is a plot diagram illustrating a measured value (the worst value of frequency deviation (absolute value) of the oscillator 1 at −40° C. to +85° C.) of the frequency deviation of the oscillator 1 with a nominal frequency 19.2 MHz, using each of three resonator elements with frequency variable sensitivities different from each other as the resonator element 3. In FIG. 6, a horizontal axis denotes compensation voltage sensitivity (unit: ppm/V) at a central voltage in a variable range of a temperature compensation voltage, and a vertical axis denotes the frequency deviation (worst value) (unit: ppm) of the oscillator 1. A solid line is a curved line which approximates a second order polynomial with respect to three points (A point, B point, and C point) which are plotted, and satisfies $y=0.036x^2-0.3242x+7.4074$, if a horizontal axis is referred to as x and a vertical axis is referred to as y. As illustrated in FIG. 6, the frequency deviation (worst value) (A point) of the oscillator 1 with compensation voltage sensitivity of approximately 32 ppm/V exceeds 0.7 ppm, while the frequency deviation (worst value) (B point) of the oscillator 1 with compensation voltage sensitivity of approximately 41 ppm/V is smaller than 0.2 ppm. Furthermore, the frequency deviation (worst value) (C point) of the oscillator 1 with compensation voltage sensitivity of approximately 47 ppm/V is smaller than 0.15 ppm.

Figure 7A:
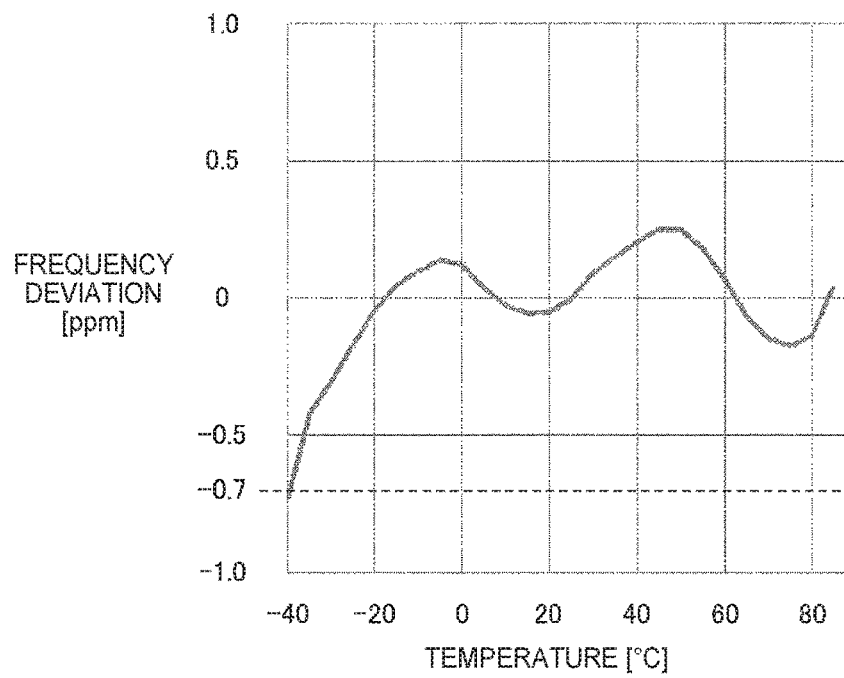
FIGS. 7A and 7B are diagrams illustrating measured values of frequency temperature characteristics of the oscillator.
Figure 7B:
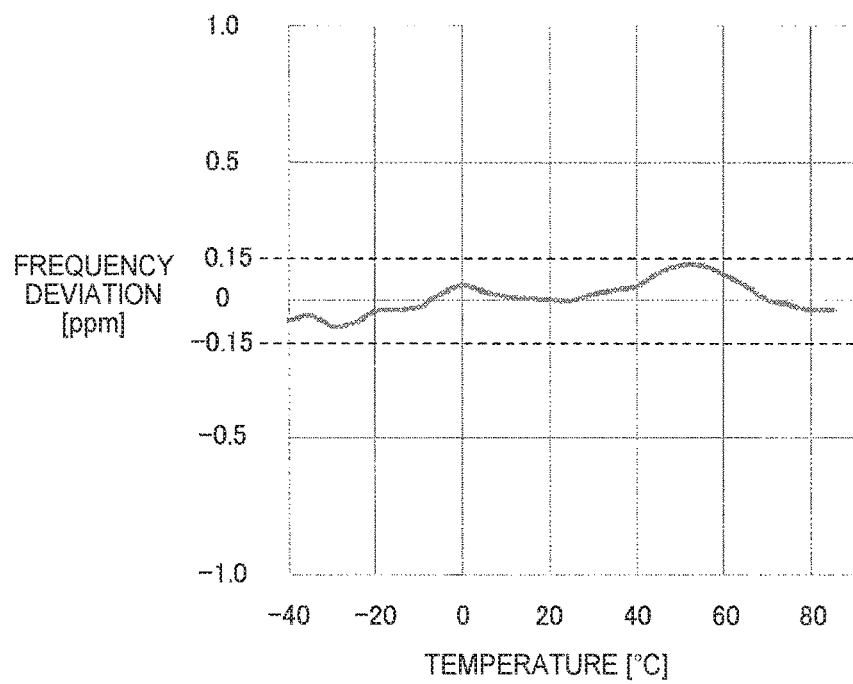

FIGS. 7A and 7B respectively illustrate a measured value of the frequency temperature characteristics of the oscillator 1 corresponding to the A point and a measured value of the frequency temperature characteristics of the oscillator 1 corresponding to the C point. In FIGS. 7A and 7B, a horizontal axis denotes temperature (unit: ° C.), and a vertical axis denotes frequency deviation (unit: ppm). As illustrated in FIG. 7A, the oscillator 1 with compensation voltage sensitivity of approximately 32 ppm/V corresponding to the A point has greatest frequency deviation (absolute value) in the vicinity of −40° C., which exceeds 0.7 ppm. In contrast to this, as illustrated in FIG. 7B, the oscillator 1 with compensation voltage sensitivity of approximately 47 ppm/V corresponding to the C point has frequency deviation of ±0.15 ppm (±150 ppb: −150 ppb or more+150 ppb or less) in a temperature range from −40° C. to +85° C.

Temperature ranges from 0° C. to +70° C., from −5° C. to +85° C., and from −40° C. to +85° C. are representative temperature ranges which define frequency temperature characteristics of an oscillator existing in the market, and a temperature compensated oscillator with characteristics of frequency deviation which is greater than or equal to −150 ppb and smaller than or equal to +150 ppb in at least a temperature range from −5° C. to +85° C. or from −40° C. to +85° C. does not exist so far. That is, the oscillator 1 which obtains a measured value (measured value of FIG. 7B) of the C point of FIG. 6 is an unprecedented novel temperature compensated oscillator, and can also be used for an electronic apparatus in which for example, an OCXO is used, and which requires high frequency accuracy.

Then, as plotted by an approximate curved line of FIG. 6, it can be said that the oscillator 1 with compensation voltage sensitivity (compensation voltage sensitivity at a central voltage of a variable range of a temperature compensation voltage) which is higher than or equal to 42 ppm/V and a frequency of 19.2 MHz has frequency deviation which is greater than or equal to −150 ppb and smaller than or equal to 150 ppb in a temperature range from −40° C. to +85° C. However, the frequency variable sensitivity of the resonator element is too high, the variable range of the temperature compensation voltage is narrowed too much, and thus, temperature compensation accuracy decreases, and the frequency deviation of the oscillator 1 can also increase. Hence, in order for the frequency deviation of the oscillator 1 with a frequency of 19.2 MHz in a temperature range from −40° C. to +85° C. to decrease to a level higher than or equal to −150 ppb and lower than or equal to 150 ppb in the approximation curved line of FIG. 6, it is preferable that compensation voltage sensitivity (compensation voltage sensitivity at a central voltage of a variable range of a temperature compensation voltage) is lower than or equal to 47 ppm/V.

By using a resonator element with high frequency variable sensitivity which is not used in the temperature compensated oscillator of the related art, as the resonator element 3, the oscillator 1 with compensation voltage sensitivity which is higher than or equal to 42 ppm/V and lower than or equal to 47 ppm can be realized.

Since frequency variable sensitivity of the resonator element 3 increases in proportion to sizes of the excitation electrodes 3a and 3b of the resonator element 3, the resonator element 3 with high frequency variable sensitivity can be realized by increasing the excitation electrodes 3a and 3b. However, if the excitation electrodes 3a and 3b become large, the resonator element 3 becomes too large, and thereby miniaturization of the oscillator 1 is disturbed, and in addition, frequency variable sensitivity of the resonator element 3 becomes too high, and thereby the frequency temperature characteristics of the oscillator 1 can become poor. Accordingly, it is preferable that the excitation electrodes 3a and 3b (resonator element 3) have proper sizes.

Figure 8:
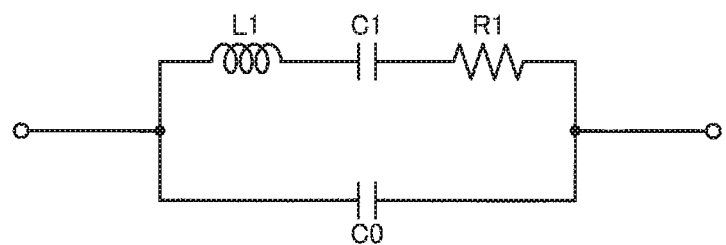
FIG. 8 is an equivalent circuit diagram of a resonator element.

Here, in an equivalent circuit of the resonator element 3 illustrated in FIG. 8, an equivalent parallel capacitance C0 is determined by areas of the excitation electrodes 3a and 3b and an interval between the excitation electrodes 3a and 3b, and the greater the equivalent parallel capacitance C0 is, the greater an equivalent series capacitance C1 is, too. Accordingly, there is a correlation between the equivalent series capacitance C1 and the compensation voltage sensitivity.

Figure 9:
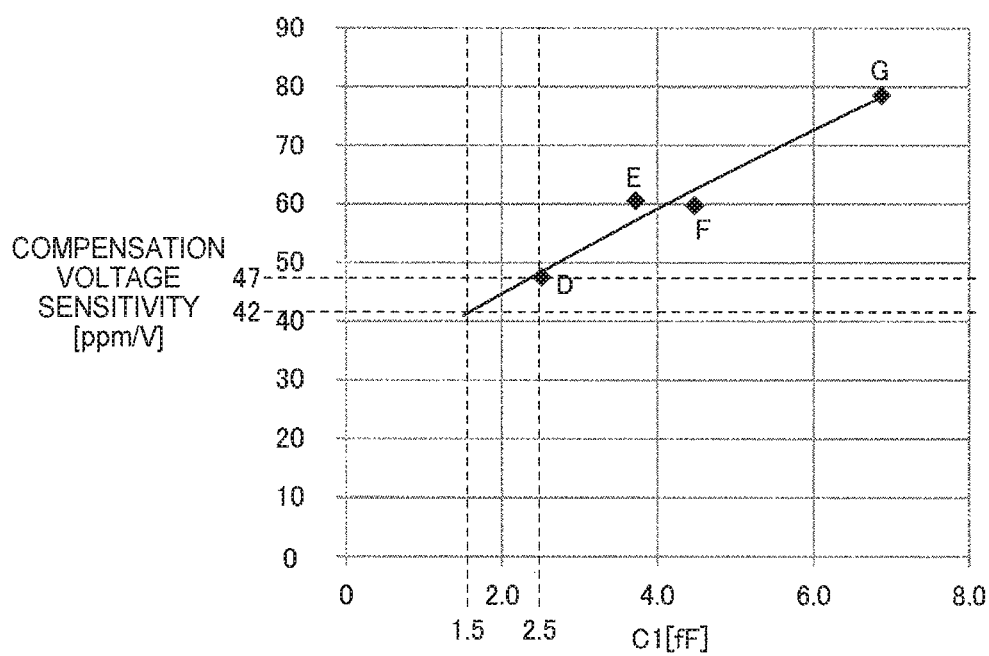
FIG. 9 is a plot diagram illustrating compensation voltage sensitivity of the oscillator.

FIG. 9 is a plot diagram illustrating compensation voltage sensitivity of the oscillator 1 which uses each of four resonator elements having equivalent series capacitances C1 different from each other as the resonator element 3. In FIG. 9, a horizontal axis denotes the equivalent series capacitance C1 (unit: fF), and a vertical axis denotes compensation voltage sensitivity (unit: ppm/V) at a central voltage in a variable range of a temperature compensation voltage. A solid line is a straight line which linearly approximates to the plotted four points (D point, E point, F point, and G point). If the horizontal axis is referred to as x and the vertical axis is referred to as y, the solid line is a straight line which satisfies y=6.793x+31.662. As plotted by an approximate straight line of FIG. 9, it can be said that the oscillator 1 which uses a resonator element having the equivalent series capacitance C1 which is greater than 1.5 fF as the resonator element 3 has compensation voltage sensitivity (compensation voltage sensitivity at a central voltage of a variable range of a temperature compensation voltage) which is higher than or equal to 42 ppm/V. In addition, the oscillator 1 which uses a resonator element having the equivalent series capacitance C1 which is smaller than 2.5 fF as the resonator element 3 has compensation voltage sensitivity (compensation voltage sensitivity at a central voltage of a variable range of a temperature compensation voltage) lower than or equal to 47 ppm/V.

That is, by using a resonator element having the equivalent series capacitance C1 which is greater than 1.5 fF and smaller than 2.5 fF is used as the resonator element 3, the oscillator 1 with compensation voltage sensitivity (compensation voltage sensitivity at a central voltage of a variable range of a temperature compensation voltage) which is higher than or equal to 42 ppm/V and lower than or equal to 47 ppm/V, frequency deviation which is greater than or equal to −150 ppb and smaller than or equal to +150 ppb, and a frequency of 19.2 MHz in a temperature range from −40° C. to +85° C., can be realized.

However, a resonator element is used in which the higher the frequency of the oscillator 1 is, the higher a resonance frequency is, as the resonator element 3. A resonance frequency Fr is represented by Equation (1), using the equivalent series capacitance C1 and an equivalent series inductance L1 in the equivalent circuit of FIG. 8.

$$Fr = 2\pi\sqrt{\frac{1}{L1 \cdot C1}} \qquad (1)$$

As the resonator element 3 has a high resonance frequency, the resonator reed is thinned, mass is reduced, and thereby, the equivalent series inductance L1 decreases. In addition, an interval between the excitation electrodes 3a and 3b is reduced, and thereby the equivalent series capacitance C1 increases. Then, since the equivalent series capacitor C1 increases, the compensation voltage sensitivity of the oscillator 1 becomes higher.

Figure 10:
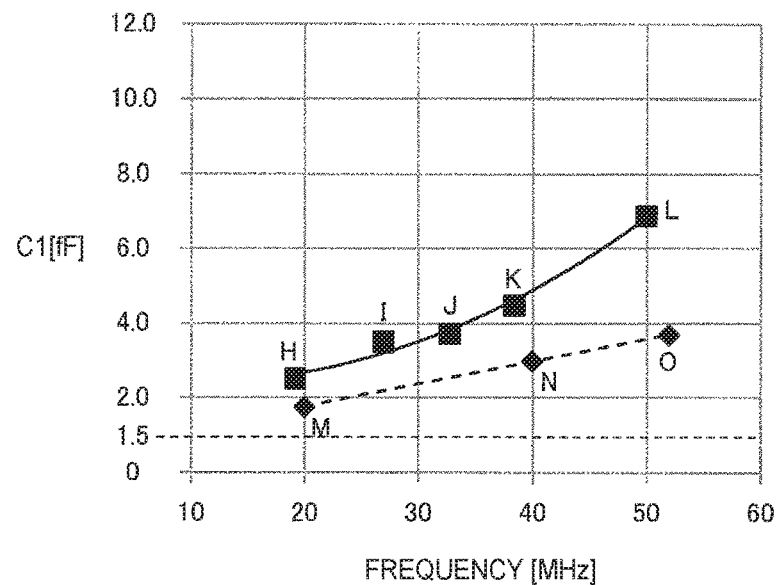
FIG. 10 is a diagram illustrating a relationship between a frequency of the oscillator and an equivalent series capacitance.

FIG. 10 is a diagram illustrating a relationship between the frequency of the oscillator 1 and the equivalent series capacitance C1. In FIG. 10, a horizontal axis denotes a nominal frequency (resonance frequency of the resonator element 3) (unit: MHz) of the oscillator 1, and a vertical axis denotes the equivalent series capacitance C1 (unit: fF). In FIG. 10, an H point, an I point, a J point, a K point, and an L point are measured values of the equivalent series capacitance C1 in the oscillator 1 which uses each of five resonator elements including excitation electrodes having the same size and different resonance frequencies as the resonator element 3. In addition, an M point, an N point, and an O point are measured values of the equivalent series capacitance C1 in the oscillator 1 which uses each of three resonator elements including excitation electrodes having the same size and different resonance frequencies as the resonator element 3. Resonator elements corresponding to the H point, the I point, the J point, the K point, and the L point are larger in size and are higher in frequency variable sensitivity than resonator elements corresponding to the M point, the N point, and the O point. A solid line is a curved line which approximates a second order polynomial with respect to the five points (H point, I point, J point, K point, and L point) which are plotted, and satisfies $y=0.00279x^2−0.05684x+2.69481$, if a horizontal axis is referred to as x and a vertical axis is referred to as y. In addition, a dashed line is a straight line which linearly approximates the three points (M point, N point, and O point) which are plotted, and satisfies y=0.06x+0.55, if a horizontal axis is referred to as x and a vertical axis is referred to as y.

As described above, since it can be said that compensation voltage sensitivity is higher than or equal to 42 ppm/V in the oscillator 1, if the equivalent series capacitance C1 is greater than 1.5 fF, all the oscillators 1 corresponding to the H point, the I point, the J point, the K point, the L point, the M point, the N point, and the O point, have compensation voltage sensitivity which is higher than or equal to 42 ppm/V. In addition, as plotted by an approximate straight line of the dashed line, since it can be said that the oscillator 1 having the equivalent series capacitance C1 which satisfies C1≥0.06×Fr+0.55 (fF) has compensation voltage sensitivity which is higher than or equal to 42 ppm/V when the resonance frequency of the resonator element 3 is set to Fr, the frequency deviation at temperature which is higher than or equal to −40° C. and lower than or equal to +85° C. can satisfy the frequency temperature characteristics which are higher than or equal to −150 ppb and lower than or equal to +150 ppb. Furthermore, as plotted by an approximate curved line of the solid line, since it can be said that the oscillator 1 having the equivalent series capacitance C1 (fF) which satisfies C1≥0.00279×Fr$^2$−0.05684×Fr+2.69481 has compensation voltage sensitivity which is considerably higher than 42 ppm/V when the resonance frequency of the resonator element 3 is set to Fr (MHz), the frequency deviation at temperature which is higher than or equal to −40° C. and lower than or equal to +85° C. can satisfy more easily the frequency temperature characteristics which are higher than or equal to −150 ppb and lower than or equal to +150 ppb.

As described above, it is preferable that, in the oscillator 1 with a frequency of 19.2 MHz, the compensation voltage sensitivity is 47 ppm or lower (the equivalent series capacitance C1 is lower than or equal to 2.5 fF), in order to satisfy the frequency deviation which is greater than or equal to −150 ppb and smaller than or equal to +150 ppb, but an upper limit value of the compensation voltage sensitivity (equivalent series capacitance C1) changes depending upon the frequency of the oscillator 1. Hence, it is preferable that the excitation electrodes 3a and 3b (resonator element 3) of the resonator element 3 are made to be a proper size according to the frequency of the oscillator 1.

Figure 11:
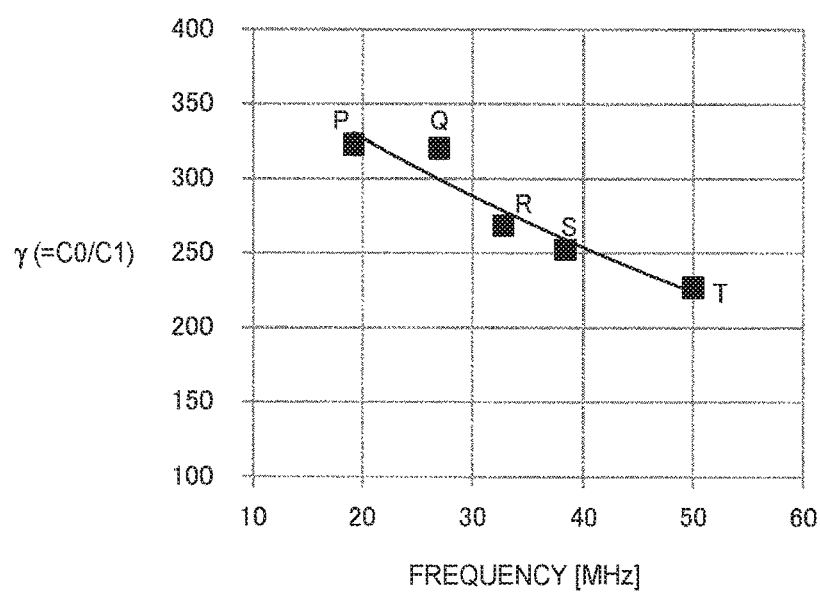
FIG. 11 is a diagram illustrating a relationship between the frequency of the oscillator, and a capacitance ratio between an equivalent parallel capacitance and an equivalent series capacitance.

In FIG. 10, conditions of the oscillator 1 with excellent frequency temperature characteristics are defined by a relationship between the frequency of the oscillator 1 and the equivalent series capacitance C1, but can be defined by a relationship between the frequency of the oscillator 1, and a capacitance ratio γ (=C0/C1) between the equivalent parallel capacitor C0 and the equivalent series capacitance C1. FIG. 11 is a diagram illustrating a relationship between the frequency of the oscillator 1 and the capacitance ratio γ, a horizontal axis denotes a nominal frequency (resonance frequency of the resonator element 3) (unit: MHz) of the oscillator 1, and a vertical axis denotes the capacitance ratio γ. In FIG. 11, a P point, a Q point, an R point, an S point, and a T point are measured values of the capacitance ratio γ of the oscillator 1 which uses each of five resonator elements corresponding to the H point, the I point, the J point, the K point, and the L point of FIG. 10 as the resonator element 3. A solid line is a curved line which approximates a second order polynomial with respect to the five points (P point, Q point, R point, S point, and T point) which are plotted, and satisfies y=0.022x$^2$−4.969x+417.929, if a horizontal axis is referred to as x and a vertical axis is referred to as y. As plotted by an approximate curved line thereof, it can be said that the oscillator 1 having the capacitance ratio γ (=C0/C1), which satisfies γ≥0.022×Fr$^2$−4.969×Fr+417.929, between the equivalent parallel capacitance C0 and the equivalent series capacitance C1 when the resonance frequency of the resonator element 3 is set to Fr (MHz), easily satisfies frequency temperature characteristics which are higher than or equal to −150 ppb and lower than or equal to +150 ppb in a temperature range from −40° C. to +85° C.

Effects

As described above, according to the present embodiment, the resonator element 3 having the equivalent series capacitance C1 which is greater than 1.5 fF, or the resonator element 3 with compensation voltage sensitivity which is higher than or equal to 42 ppm/V is used, and thus, it is possible to realize the oscillator 1 of an unprecedented novel temperature compensation type which has characteristics of frequency deviation which is greater than or equal to −150 ppb and smaller than or equal to +150 ppb in a temperature range from −40° C. to +85° C., and which can be used for an electronic apparatus in which an OCXO is used and which requires high frequency accuracy.

Particularly, by using the resonator element 3 in which the equivalent series capacitance C1 (fF) satisfies C1≥0.00279×Fr$^2$−0.05684×Fr+2.69481, or the capacitance ratio γ (=C0/C1) between the equivalent parallel capacitor C0 and the equivalent series capacitance C1 satisfies γ≥0.022×Fr$^2$−4.969×Fr+417.929, when the resonance frequency of the resonator element is set to Fr (MHz), it is possible to realize an oscillator with compensation voltage sensitivity which is considerably higher than 42 ppm/V and higher frequency accuracy.

In the temperature compensation adjustment step S50 of FIG. 4, frequency temperature characteristics (including frequency temperature characteristics of the resonator element 3 and temperature characteristics of the integrated circuit (IC) 2) of the oscillator 1 approximates an nth order equation which uses temperature (an output voltage of the temperature sensor 50) as a variable, temperature compensation data (first order compensation data, . . . , nth order compensation data) according to an approximation equation is generated, and thus, it is necessary to more correctly approximate the frequency temperature characteristics of the oscillator 1 in order to realize the above-described characteristics. Here, since frequency temperature characteristics of the resonator element 3 is dominant in frequency temperature characteristics of the oscillator 1, it is preferable that frequency temperature characteristics of the resonator element 3 approximate more correctly, in other words, frequency deviation with respect to an approximation equation of the frequency temperature characteristics of the resonator element 3 is smaller.

Figure 12:
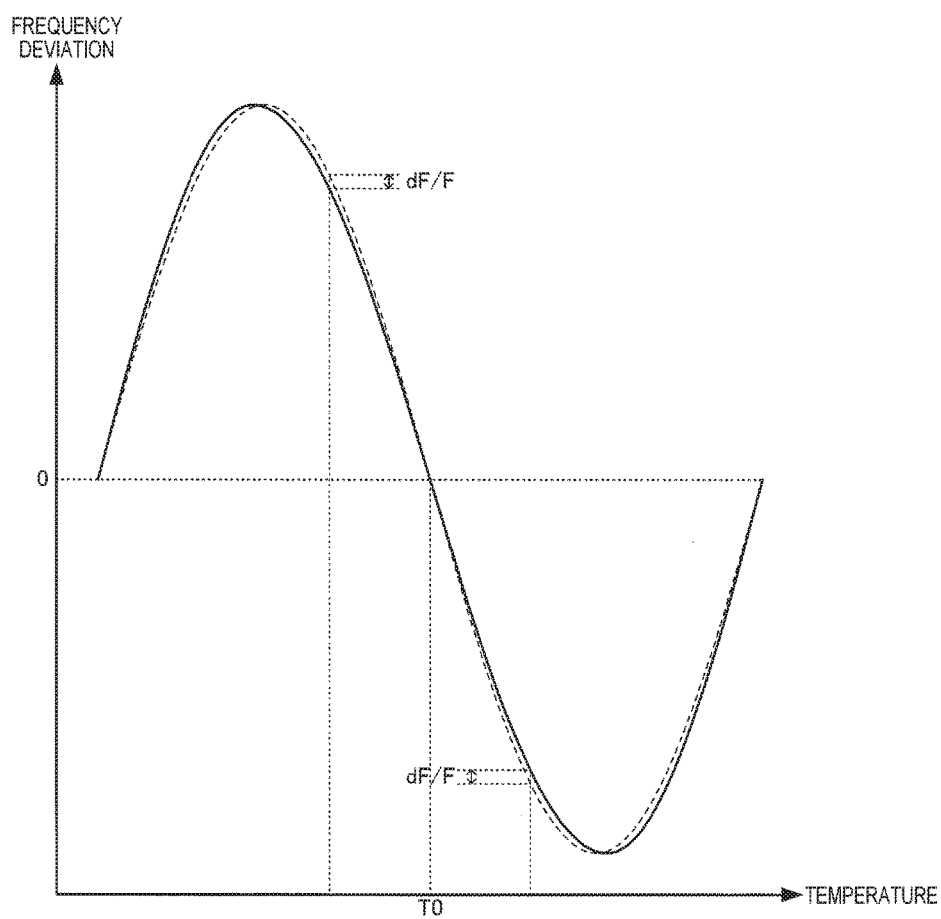
FIG. 12 is an explanatory diagram illustrating frequency deviation of the resonator element.

For example, if the resonator element 3 is an AT cut resonator element, frequency temperature characteristics thereof (solid line of FIG. 12) exhibits a third order curved line (a major order number is 3) as illustrated in FIG. 12, and thus, it is preferable that the frequency deviation dF/F of the resonator element 3 with respect to an approximation equation (dashed line of FIG. 12) which is higher than or equal to a third order of the frequency temperature characteristics of the resonator element 3 is greater than or equal to −150 ppb and smaller than or equal to +150 ppb in a temperature range from 0° C. to +70° C., from −5° C. to +85° C., or from −40° C. to +85° C. According to this, it is possible to easily generate temperature compensation data for realizing the oscillator 1 with frequency deviation which is greater than or equal to −150 ppb and smaller than or equal to +150 ppb in a temperature range from 0° C. to +70° C., from −5° C. to +85° C., or from −40° C. to +85° C., in the temperature compensation adjustment step S50, even if variations of the temperature characteristics of the integrated circuit (IC) 2 are taken into account. As a result, in step S70 of FIG. 4, if it is evaluated whether or not the frequency deviation is within a range from −150 ppb to +150 ppb, a probability that products pass increases, and thus, it is possible to increase the yield.

Since the frequency temperature characteristics of the resonator element 3 change depending upon parameters such as, positions or shapes of the excitation electrodes 3a and 3b, or a shape or size of the resonator element 3, it is possible to realize the resonator element 3 with frequency deviation dF/F which is greater than or equal to −150 ppb and smaller than or equal to +150 ppb in a temperature range from −40° C. to +85° C., by determining parameter values such that a dip in the frequency temperature characteristics does not occur, for example, even at an upper limit or a lower limit of variation of characteristics at the time of mass production, in a design step of the resonator element 3.

Furthermore, in the temperature compensation adjustment step S50, it is efficient that, in order to more reflect the temperature characteristics of the integrated circuit (IC) 2 to temperature compensation data to be generated, the number of temperatures for measuring a frequency increases, or the frequency temperature characteristics of the oscillator 1 approximate to higher order equations. For example, if the resonator element 3 is an AT cut resonator element, it is preferable that a frequency is measured at temperature which is higher than or equal to 10 points in a temperature range from −40° C. to +85° C. and the frequency temperature characteristics of the oscillator 1 approximate to equations which are higher than or equal to a fifth order. If doing so, in the temperature compensation adjustment step, the temperature characteristics of the integrated circuit (IC) 2 are also added, and temperature compensation data for realizing the oscillator 1 with frequency deviation of the frequency temperature characteristics which is greater than or equal to −150 ppb and smaller than or equal to +150 ppb in a temperature range from −40° C. to +85° C. is easily generated. As a result, it is possible to further increase yield.

The oscillator 1 according to the present embodiment described above is an oscillator (VC-TCXO or the like) having a temperature compensation function and a voltage control function (frequency control function), but may be a temperature compensated oscillator (TCXO or the like) without the voltage control function (frequency control function). In addition, the oscillator 1 according to the present embodiment described above may be a voltage controlled oscillator (VCXO or the like) which includes the AFC circuit 32 as a frequency control circuit, and which does not include a temperature compensation function.

2. Electronic Apparatus

Figure 13:
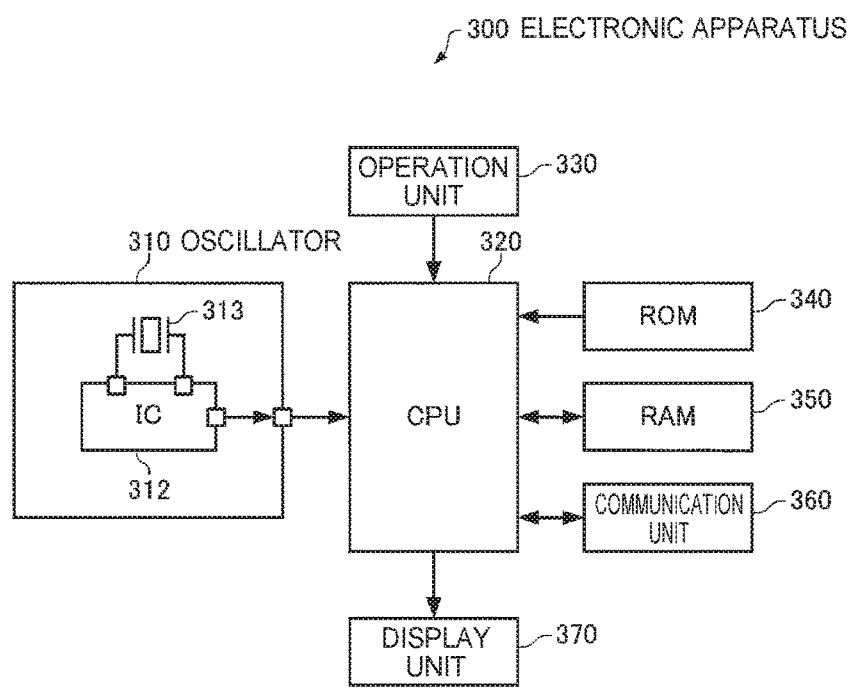
FIG. 13 is a functional block diagram illustrating an example of a configuration of an electronic apparatus according to the present embodiment.
Figure 14:
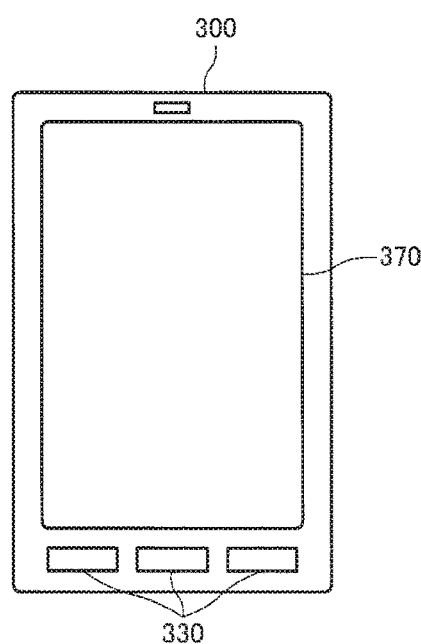
FIG. 14 is a view illustrating an example of an appearance of the electronic apparatus according to the present embodiment.

FIG. 13 is a functional block diagram illustrating an example of a configuration of an electronic apparatus according to the present embodiment. FIG. 14 is a view illustrating an example of an appearance of a smart phone which is an example of the electronic apparatus according to the present embodiment.

An electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. The electronic apparatus according to the present embodiment may have a configuration in which a part of the configuration elements (each unit) of FIG. 13 is omitted or changed, or may have a configuration in which other configuration elements are added.

The oscillator 310 includes an integrated circuit (IC) 312 and a resonator element 313. The integrated circuit (IC) 312 generates an oscillation signal by oscillating the resonator element 313. The oscillation signal is output from an external terminal of the oscillator 310 to the CPU 320.

The CPU 320 performs various types of calculation processing or control processing, using the oscillation signal which is input from the oscillator 310 as a clock signal, according to a program that is stored in the read only memory (ROM) 340 or the like. Specifically, the CPU 320 performs various types of processing according to an operation signal from the operation unit 330, processing of controlling the communication unit 360 for performing data communication with an external device, processing of transmitting a display signal for displaying various types of information in the display unit 370, or the like.

The operation unit 330 is an input device which is configured by operation keys, button switches, or the like, and outputs operation signals according to operations performed by a user to the CPU 320.

The ROM 340 stores programs for performing various types of calculation processing or control processing which are performed by the CPU 320, data, or the like.

The RAM 350 is used as a working area of the CPU 320, and temporarily stores programs or data that are read from the ROM 340, data which is input from the operation unit 330, arithmetic results that are obtained by executing various programs performed by the CPU 320, or the like.

The communication unit 360 performs various controls for performing data communication between the CPU 320 and an external device.

The display unit 370 is a display device which is configured by a liquid crystal display (LCD) or the like, and displays various types of information, based on a display signal which is input from the CPU 320. A touch panel which functions as the operation unit 330 may be provided in the display unit 370.

It is possible to realize an electronic apparatus with high reliability by employing, for example, the above-described oscillator 1 according to the present embodiment as the oscillator 310.

Various types of electronic apparatuses may be used as the electronic apparatus 300. For example, a personal computer (for example, a mobile type personal computer, a laptop type personal computer, a tablet type personal computer), a mobile terminal such as a smart phone or a mobile phone, a digital camera, an ink jet type ejection device (for example, an ink-jet printer), a storage area network apparatus such as a router or a switch, a local area network apparatus, an apparatus for a mobile terminal base station, a television, a video camera, a video recorder, a car navigation device, a real-time clock device, a pager, an electronic organizer (also including a communication function), an electronic dictionary, an electronic calculator, an electronic game apparatus, a controller for game, a word processor, a workstation, a video telephone, a television monitor for crime prevention, electronic binoculars, a POS terminal, a medical apparatus (for example, an electronic thermometer, a blood pressure monitor, a blood glucose meter, an electrocardiogram measuring device, an ultrasonic diagnostic apparatus, an electronic endoscope), a fish finder, various measurement apparatuses, instruments (for example, instruments such as, a vehicle, an aircraft, or a ship), a flight simulator, a head-mounted display, a motion tracing device, a motion tracking device, a motion controller, a pedestrian position orientation measurement (PDR), or the like is used.

As an example of the electronic apparatus 300 according to the present embodiment, a transfer device which functions as, for example, a device for terminal station, or the like which performs wireless or wired communication with a terminal, using the above-described oscillator 310 as a reference signal source, a voltage controlled oscillator (VCO), or the like. By employing, for example, the above-described oscillator 1 according to the present embodiment as the oscillator 310, it is also possible to realize the electronic apparatus 300 which can be used for, for example, a communication station or the like, and which has high frequency accuracy, high performance, and high reliability, at a lower cost than the related art.

3. Moving Object

Figure 15:
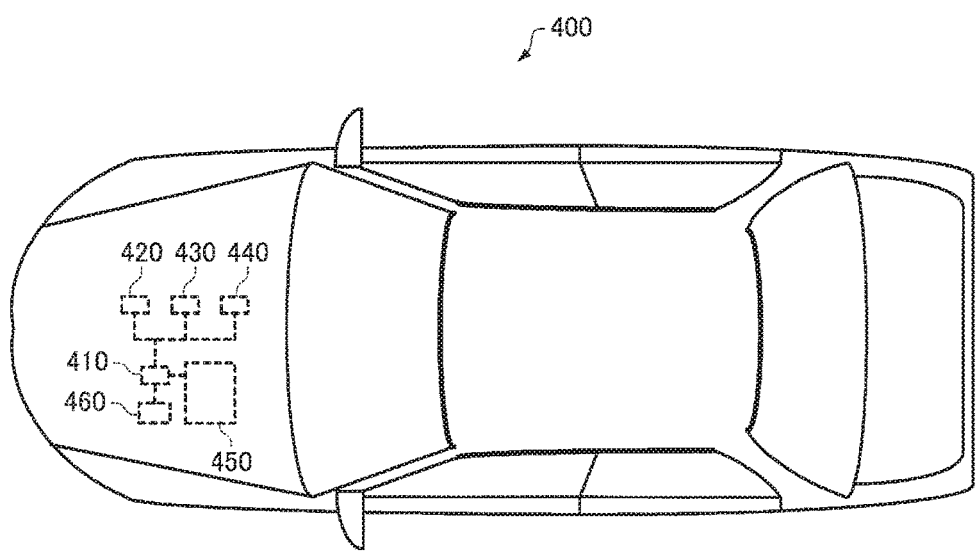
FIG. 15 is a view illustrating an example of a moving object according to the present embodiment.

FIG. 15 is a view (top view) illustrating an example of a moving object according to the present embodiment. A moving object 400 illustrated in FIG. 15 is configured to include an oscillator 410, controllers 420, 430, and 440 which perform various controls of an engine system, a brake system, a keyless entry system, and the like, a battery 450, and a backup battery 460. The moving object according to the present embodiment may have a configuration in which a part of the configuration elements (each unit) of FIG. 15 is omitted, or other configuration elements are added.

The oscillator 410 includes an integrated circuit (IC) and a resonator element which are not illustrated, and the integrated circuit (IC) generates an oscillation signal by oscillating the resonator element. The oscillation signal is output from an external terminal of the oscillator 410 to the controllers 420, 430, and 440, and is used as, for example, a clock signal.

The battery 450 supplies power to the oscillator 410 and the controllers 420, 430, and 440. The backup battery 460 supplies power to the oscillator 410 and the controllers 420, 430, and 440, when an output voltage of the battery 450 is lower than a threshold.

It is possible to realize a moving object with high reliability by employing, for example, the above-described oscillator 1 according to the present embodiment as the oscillator 410.

Various moving objects can be used as the moving object 400. For example, a vehicle (including an electric vehicle), an aircraft such as a jet plane or a helicopter, a ship, a rocket, an artificial satellite, or the like can be used as the moving object 400.

The invention is not limited to the present embodiment, and various modifications can be made within a range of the spirit of the invention.

The above-described embodiments and modification examples are examples, and the invention is not limited to the examples. For example, it is possible to appropriately combine each embodiment and each modification example.

The invention includes substantially the same configuration (for example, a function, a configuration having the same method and effects, or a configuration having the same objective and effects) as the configurations described in the embodiments. In addition, the invention includes a configuration in which non-essential portions of the configurations described in the embodiments are replaced. In addition, the invention includes a configuration in which the same actions and effects, or the same objectives as those of the configurations described in the embodiments can be achieved. In addition, the invention includes a configuration in which a known technology is added to the configuration described in the embodiments.

The entire disclosure of Japanese Patent Application No. 2015-067358, filed Mar. 27, 2015 is expressly incorporated by reference herein.

What is claimed is:

1. An oscillator comprising:
a resonator element including a first excitation electrode and a second excitation electrode;
an oscillation circuit which outputs an oscillation signal by oscillating the resonator element, the oscillation circuit configured to output the oscillation signal based upon (1) a frequency adjustment signal received from a frequency adjustment circuit and (2) a temperature compensation signal received from a temperature compensation circuit; and
a frequency control circuit which controls an oscillation frequency of the oscillation signal,
wherein, if a resonance frequency of the resonator element is referred to as Fr (MHz) and an equivalent series capacitance is referred to as C1 (fF) and an equivalent parallel capacitance is referred to as C0, a relationship of $C1 \geq 0.00279 \times Fr^2 - 0.05684 \times Fr + 2.69481$ is satisfied, wherein C0 corresponds to an area of the first excitation electrode and an area of the second excitation electrode.

2. The oscillator according to claim 1, wherein the equivalent series capacitance is greater than 1.5 fF.

3. The oscillator according to claim 1,
wherein the frequency control circuit includes a circuit which changes the oscillation frequency with respect to a voltage which is input, and
wherein a change ratio between the voltage which is input and the oscillation frequency is greater than or equal to 42 ppm/V.

4. The oscillator according to claim 2,
wherein the frequency control circuit includes a circuit which changes the oscillation frequency with respect to a voltage which is input, and
wherein a change ratio between the voltage which is input and the oscillation frequency is greater than or equal to 42 ppm/V.

5. The oscillator according to claim 1, wherein, if a capacitance ratio of the resonator element is referred to as $\gamma$, a relationship of $\gamma = C0/C1$, and $\gamma \leq 0.022 \times Fr^2 - 4.969 \times Fr + 417.929$ is satisfied.

6. The oscillator according to claim 1, wherein deviation from a desired frequency of the oscillation frequency is greater than or equal to −150 ppb and smaller than or equal to +150 ppb in a temperature range from −40° C. to +85° C.

7. The oscillator according to claim 1, wherein deviation of resonance frequency with respect to an approximation equation higher than or equal to a third order of a frequency temperature characteristics of the resonator element, is greater than or equal to −150 ppb and smaller than or equal to +150 ppb.

8. An oscillator comprising:
a resonator element including a first excitation electrode and a second excitation electrode;
an integrated circuit including a frequency adjustment circuit which outputs a frequency adjustment signal, a temperature compensation circuit which outputs a temperature compensation signal, an oscillation circuit which outputs an oscillation signal by oscillating the resonator element, a frequency control circuit which controls an oscillation frequency of the oscillation signal, and a first surface in which a terminal that is electrically connected to the resonator element is disposed, the oscillation signal based upon the frequency adjustment signal and the temperature compensation signal;
a first container which contains the resonator element and includes a first lid of a metal which overlaps the resonator element in a planar view; and
a second container which contains the first container and the integrated circuit,
wherein the first container is disposed such that a surface of the first container opposite to the first lid side faces an inner surface of the second container,
wherein the integrated circuit having a surface on a side opposite to the first surface is bonded to the first lid through an adhesive member, and
wherein, if a resonance frequency of the resonator element is referred to as Fr (MHz) and an equivalent series capacitance is referred to as C1 (fF) and an equivalent parallel capacitance is referred to as C0, a relationship of $C1 \geq 0.00279 \times Fr^2 - 0.05684 \times Fr + 2.69481$ is satisfied, wherein C0 corresponds to an area of the first excitation electrode and an area of the second excitation electrode.

9. The oscillator according to claim 8, wherein the equivalent series capacitance is greater than 1.5 fF.

10. The oscillator according to claim 8,
wherein the frequency control circuit includes a circuit which changes the oscillation frequency with respect to a voltage which is input, and
wherein a change ratio between the voltage which is input and the oscillation frequency is greater than or equal to 42 ppm/V.

11. The oscillator according to claim 8,
wherein the second container includes a second lid which overlaps the first container and the integrated circuit in a planar view,
wherein the inner surface includes a surface on which wires are disposed, and a surface on which the second lid is exposed, and
wherein the first container is disposed on a surface on which the wires are disposed.

12. An electronic apparatus, comprising:
the oscillator according to claim 1.

13. An electronic apparatus, comprising:
the oscillator according to claim 8.

14. A moving object, comprising:
the oscillator according to claim 1.

15. A moving object, comprising:
the oscillator according to claim 8.

* * * * *